United States Patent [19]
Wang

[11] Patent Number: 5,904,543
[45] Date of Patent: May 18, 1999

[54] METHOD FOR FORMATION OF OFFSET TRENCH ISOLATION BY THE USE OF DISPOSABLE SPACER AND TRENCH OXIDATION

[75] Inventor: Larry Y. Wang, San Jose, Calif.

[73] Assignee: Advanced Micro Devices, Inc, Sunnyvale, Calif.

[21] Appl. No.: 08/623,632

[22] Filed: Mar. 28, 1996

[51] Int. Cl.⁶ .................................................. C03C 15/00
[52] U.S. Cl. ............................................................ 438/444
[58] Field of Search .............................. 216/84; 438/427, 438/426, 432, 425, 444; 148/DIG. 50; 257/510, 397, 513, 622

[56] References Cited

U.S. PATENT DOCUMENTS

| | | | |
|---|---|---|---|
| 4,905,065 | 2/1990 | Selcuk et al. . | |
| 5,084,408 | 1/1992 | Baba et al. | 437/62 |
| 5,360,753 | 11/1994 | Park et al. | 437/67 |
| 5,445,989 | 8/1995 | Lur et al. . | |
| 5,445,990 | 8/1995 | Yook et al. . | |
| 5,457,339 | 10/1995 | Komori et al. . | |
| 5,459,096 | 10/1995 | Venkatesan et al. . | |
| 5,460,998 | 10/1995 | Liu . | |
| 5,466,623 | 11/1995 | Shimize et al. . | |
| 5,468,675 | 11/1995 | Kaigawa . | |
| 5,468,676 | 11/1995 | Madan . | |
| 5,470,783 | 11/1995 | Chiu et al. . | |
| 5,472,904 | 12/1995 | Figura et al. . | |
| 5,472,905 | 12/1995 | Paek et al. . | |
| 5,472,906 | 12/1995 | Shimize et al. . | |
| 5,473,186 | 12/1995 | Morita . | |
| 5,474,953 | 12/1995 | Shimizu et al. . | |
| 5,719,085 | 2/1998 | Moon et al. | 438/424 |

OTHER PUBLICATIONS

Fuse, Genshu; Fukumoto, Masanori; Shinohara, Akihara; Odanaka, Shinji; Sasago, Masaru and Ohzone, Takashi, "A New Isolation Method with Boron–Implanted Sidewalls for Controlling Narrow–Width Effect" IEEE Transactions On Electron Devices, vol. ED–34, No. 2, Feb., 1987.

Sawada, Shizuo; Higuchi, Takayoshi; Mizuno, Tomohisa; Shinozaki, Satoshi and Ozawa, Osamu, "Electrical Properties for MOS LSI's Fabricated Using Stacked Oxide SWAMI Technology" IEEE Transactions on Electron Devices, vol. ED–32, No. 11, Nov. 1985.

*Primary Examiner*—Donna C Wortman
*Assistant Examiner*—Brenda G. Brumback
*Attorney, Agent, or Firm*—Foley & Lardner

[57] ABSTRACT

A method of rounding corners of isolating trenches formed in a substrate with a planar surface includes a first step of forming a masking material on the planar surface. Edges of the masking material are offset from the corners of the isolating trenches. The second method step includes growing an oxide on an exposed portion of the substrate under high temperature. The oxidation under high temperature causes the corners of the isolating trenches to become rounded.

8 Claims, 7 Drawing Sheets

Prior Art

Fig. 4

METHOD FOR FORMATION OF OFFSET TRENCH ISOLATION BY THE USE OF DISPOSABLE SPACER AND TRENCH OXIDATION

BACKGROUND OF THE INVENTION

1. Field of the invention

The invention relates generally to a method for rounding trench corners of an integrated circuit device. More particularly, the invention relates to a method of forming an offset for an isolation trench by using disposable oxide spacers and subsequently rounding the trench corners by high temperature oxidation.

2. Related Art

Various methods have been developed to isolate devices within integrated circuits. One of the methods is known as trench etch and refill. In this method, a trench is etched into a substrate and is filled with a chemical vapor deposition (CVD) oxide. The etched trench may be shallow (depth<1 $\mu$m), of moderate depth (1$\mu$m$\leq$depth$\leq$3$\mu$m), or deep and narrow (depth>3$\mu$m and width<2$\mu$m). Deep and narrow trenches refilled with CVD oxide are particularly useful for preventing latchup and for isolating n-channel from p-channel devices in CMOS circuits.

Fabrication of trenches, however produces parasitic edge transistors at the corners of the trench sidewalls. Parasitic edge transistors are not desired because they increase the OFF current of the devices of the integrated circuit and increase the susceptibility to latchup. Parasitic edge transistors also turn on at a lower voltage than the active device, thereby causing a phenomenon known as a "subthreshold kink" in the current-voltage (I-V) characteristic curve.

Figure 1:
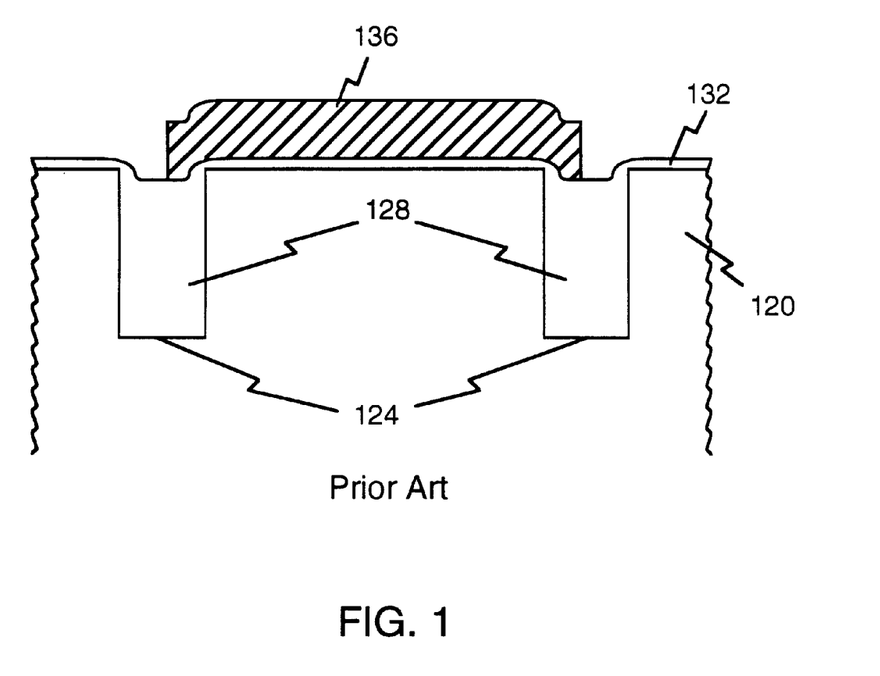
FIG. 1 shows a cross-section of a conventional integrated circuit device utilizing deep and narrow trench isolation.

FIG. 1 shows a conventional deep-and-narrow isolation trench structure. A silicon substrate 120 is formed with trenches 124. Trenches 124 are filled with an oxide 128 to isolate active devices from each other. A gate oxide 132 covers the substrate 120 and the oxide 128 in the trenches 124. A gate polysilicon (poly) electrode 136 is on top of the gate oxide 132 and positioned over the substrate 120 to form an active device with the ends of the gate poly electrode 136 extending over a portion of the trenches 124.

The oxide 128 is formed with dimples in the trenches 124. The dimples are caused by overetching of a sacrificial oxide (sacox) prior to forming the gate oxide 132. When the gate oxide 132 and the gate poly electrode 136 are added, they recess partially into the trenches 124.

The conventional structure, as shown in FIG. 1, forms parasitic edge transistors at the corners of the trenches 124. The recessed portion of the gate poly electrode 136 acts as a gate electrode of the parasitic transistor and the portion of the gate oxide between the recessed portion and the side wall of the trench 124 acts as a gate oxide of the parasitic transistor.

Further problems occur due to a thinning of the gate oxide 132 at the corners of the trenches 124 where the gate oxide 132 recesses into the trenches 124. Thinned gate oxide decreases reliability and increases the electric field strength at the trench corner, thereby exacerbating the above discussed problem regarding parasitic transistors.

SUMMARY OF THE INVENTION

It is an object of the invention to overcome the above and other problems in the prior art. Specifically, it is an object of the invention to provide an integrated circuit device which suppresses formation of the parasitic edge transistors and prevents the thinning of the gate oxide at the corners of isolation trenches.

Another object of the invention is to reduce the electric field between the gate electrode and the substrate around the isolation trench corner.

Still another object of the invention is to shut off any parasitic edge transistor that may be formed at the corners of isolation trenches.

Still another object of the invention is to improve the gate oxide quality.

Yet another object of the invention is to eliminate the subthreshold kink in the I-V characteristic curve of an integrated circuit.

The above and other objects of the invention are accomplished by a method of rounding the corners of the isolation trenches.

Additional objects and advantages of the invention will be set forth in the description which follows. The objects and advantages of the invention may be realized and obtained by means of the instrumentalities and combinations particularly pointed out in the appended claims.

BRIEF DESCRIPTION OF THE DRAWINGS

The invention is described in detail herein with reference to the drawings in which.

DETAILED DESCRIPTION OF THE PREFERRED EMBODIMENTS

Figure 2A:
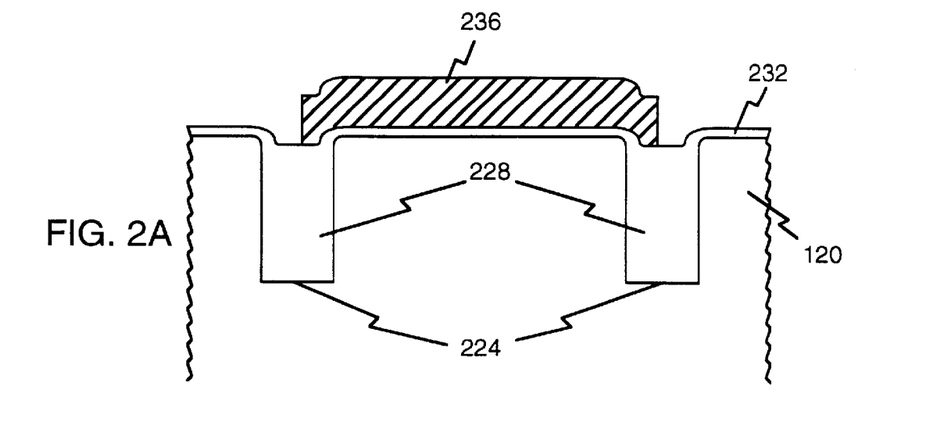
FIGS. 2A–2C show cross-sections of integrated circuit devices according to the invention.

FIG. 2A shows an integrated circuit device according to the invention. A substrate 120 is formed with trenches 224. The trenches 224 form corners with the surface of the substrate 120. Substrate 120 may be a semiconductor body such as a silicon wafer. An insulating material 232 covers the substrate 120. The insulating material 232 may be an oxide such as silicon oxide (SiO$_2$).

Figure 2B:
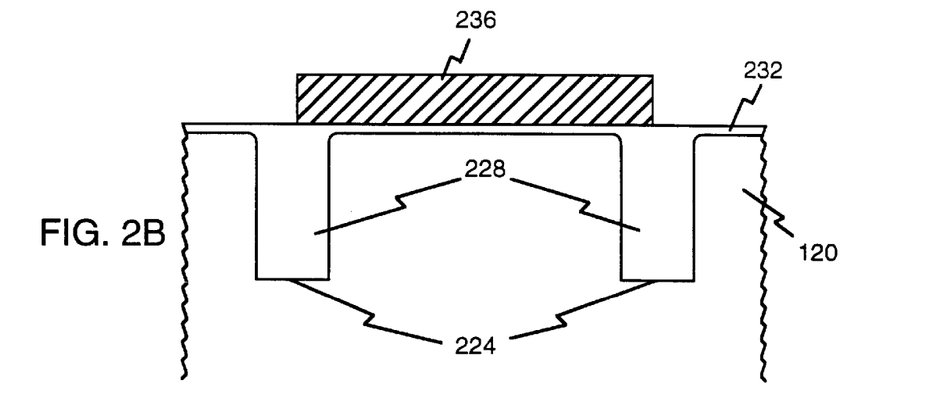
Figure 2C:
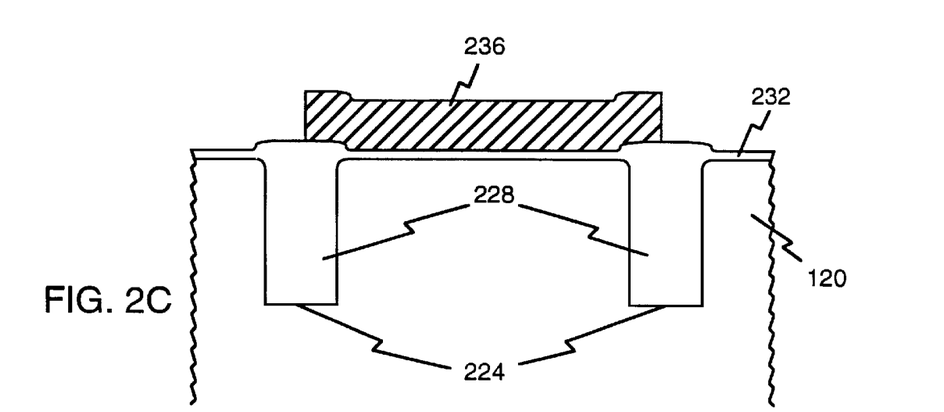

The thinning of the gate oxide occurs, in part, because the corners formed between the planar surface of the substrate 120 and the trenches 124 are relatively sharp. According to the invention, the corners are rounded. Each of the structures illustrated in FIGS. 2A–2C provide the advantage of preventing the thinning of the insulating material 232 at the trench corners. Thus, the reliability of the insulating material is improved and the electric field strength produced at the trench corners is reduced. The reduction in electric field strength contributes to suppressing the formation of parasitic edge transistors.

In the integrated circuit devices according to the invention shown in FIGS. 2B and 2C, the insulating material 232 prevents the electrode 236 from recessing into the trench 224 around the trench corners. In FIG. 2B, the insulating material 232 is substantially planar and the electrode 236 lies flat across the trench corners. In FIG. 2C, the ends of the electrode 236 are elevated at the trench corners.

A further advantage is provided by the integrated circuit devices according to the invention shown in FIGS. 2B and 2C by eliminating the kink in the subthreshold I-V characteristic curve. Any parasitic edge transistor formed at the trench corners is effectively either suppressed or shut off. By increasing the thickness of the oxide at the trench corners, a parasitic edge transistor formed at the corner would have a threshold voltage greater than the threshold voltage of the parasitic transistor's respective active device. Because the active device will turn on before the parasitic transistor, the subthreshold characteristics of the active device are not affected by the parasitic transistor. Therefore, a kink would not be exhibited in the active device's subthreshold I-V characteristic curve.

FIGS. 3A–3K illustrate the preferred steps, according to the invention, for rounding the corners of isolation trenches, as the preliminary steps to fabricating an integrated circuit device, such as the devices illustrated in FIGS. 2A to 2C.

Figure 3A:
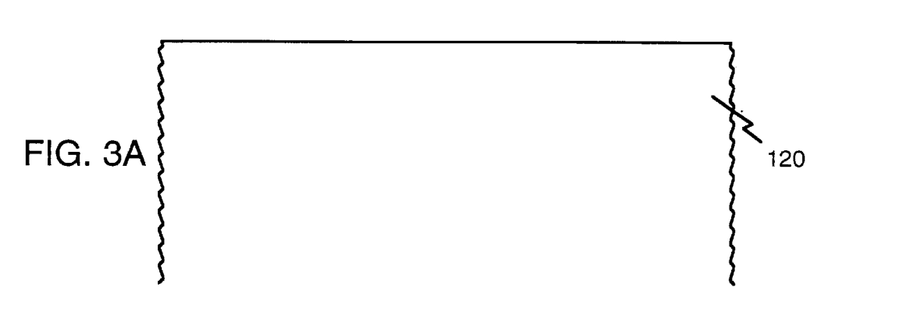
FIGS. 3A–3K show method steps for rounding isolation trench corners according to the invention.
Figure 3B:
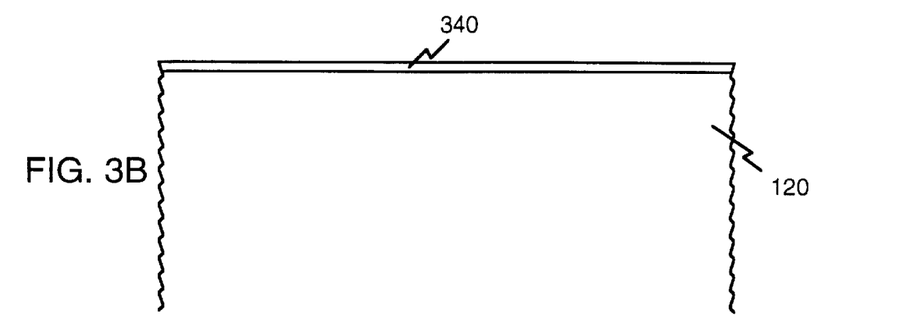

The substrate 120 is initially provided as shown in FIG. 3A. The substrate 120 is preferably silicon (Si). The surface of the substrate 120 is cleaned, and a 10–60 nm pad oxide 340, preferably silicon oxide ($SiO_2$), is thermally grown on the surface of the substrate as shown in FIG. 3B.

Alternatively, a CVD silicon oxide may be used in place of the thermally-grown pad oxide. An advantage of CVD silicon oxide is that it can be about 25% as thick as a thermally-grown pad oxide. Also, a pad oxide containing a thin thermally-grown silicon oxide layer and a buffer polysilicon layer may be used for the pad oxide 340.

Figure 3C:
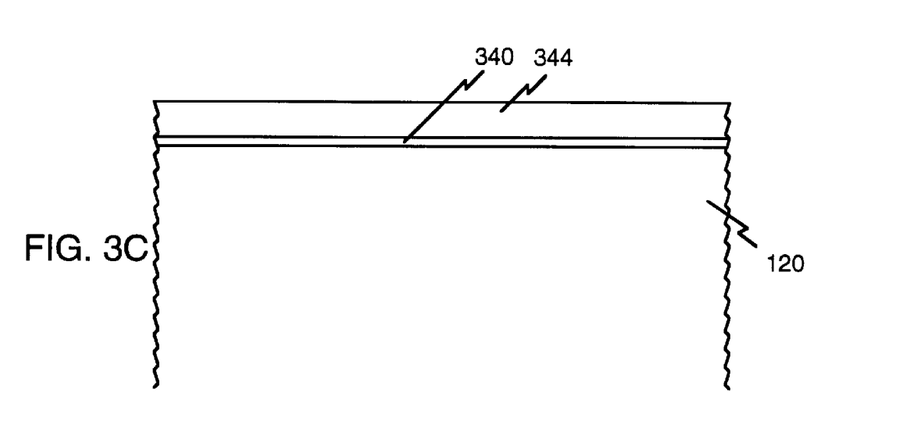

Next, a 100–200 nm thick layer of CVD silicon nitride ($Si_3N_4$) 344 is deposited on top of the pad oxide 340 as shown in FIG. 3C. The pad oxide 340 functions as a buffer layer to cushion the transition of stresses between the substrate 120 and the silicon nitride 344. The silicon nitride 344 functions as an oxidation mask. Silicon nitride is effective in this role because oxygen and water vapor diffuse slowly through it, preventing oxidizing species from reaching the silicon surface under the nitride.

Figure 3D:
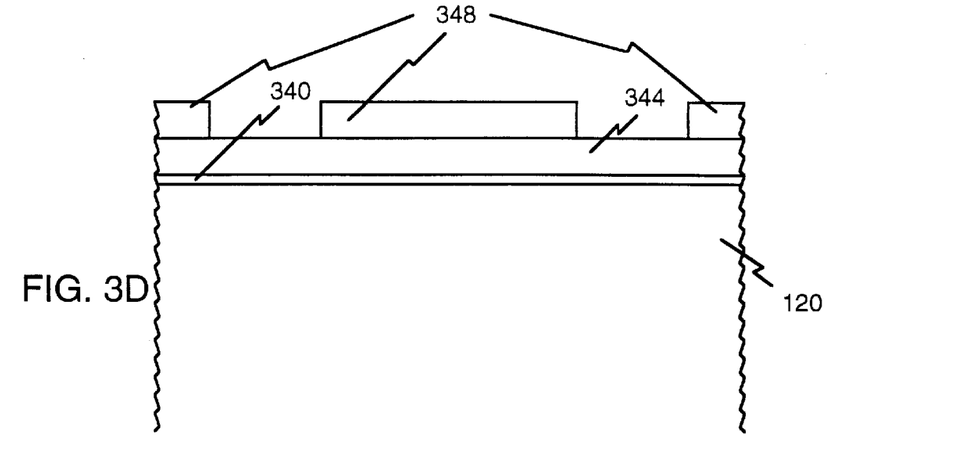
Figure 3E:
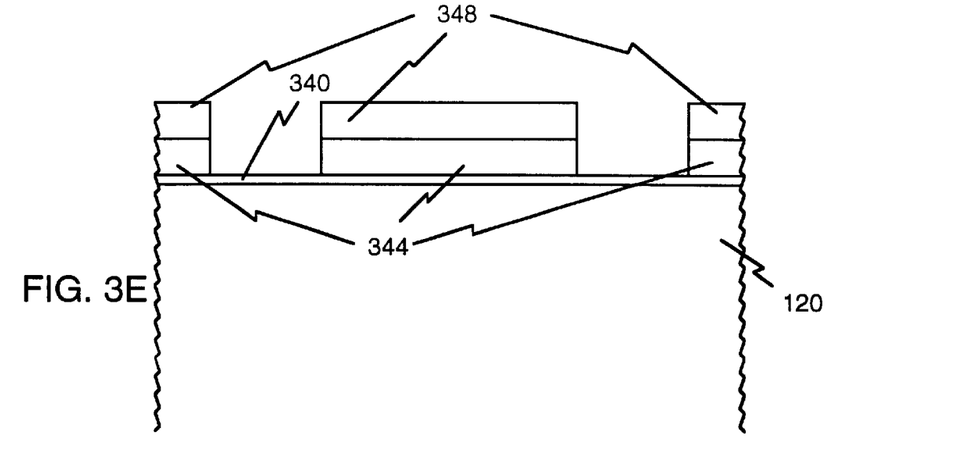
Figure 3F:
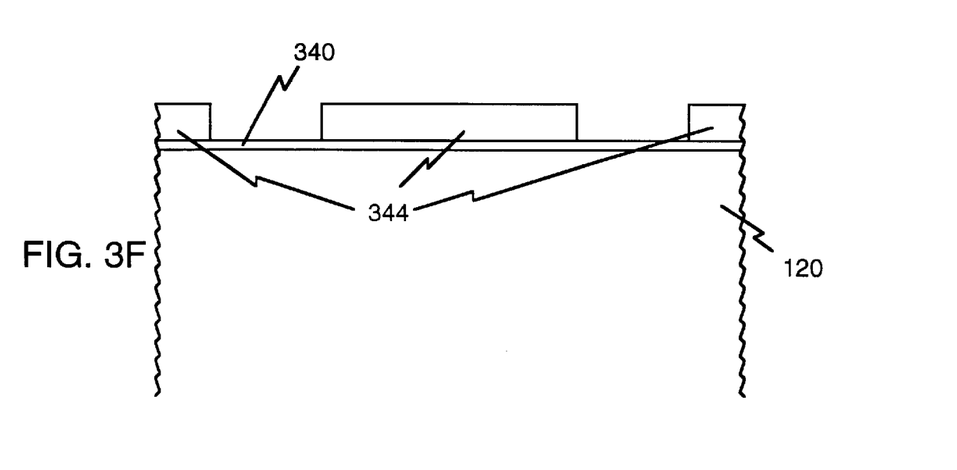

As shown in FIG. 3D, a photo-resist mask 348 is deposited on top of the silicon nitride 344. The apertures or openings in the photo-resist mask define regions which are wider than field regions for subsequent formation of isolation trenches. The areas of the silicon nitride 344 exposed through the photo-resist mask 348 are anisotropically dry etched as shown in FIG. 3E. The photo-resist mask is removed as shown in FIG. 3F.

Figure 3G:
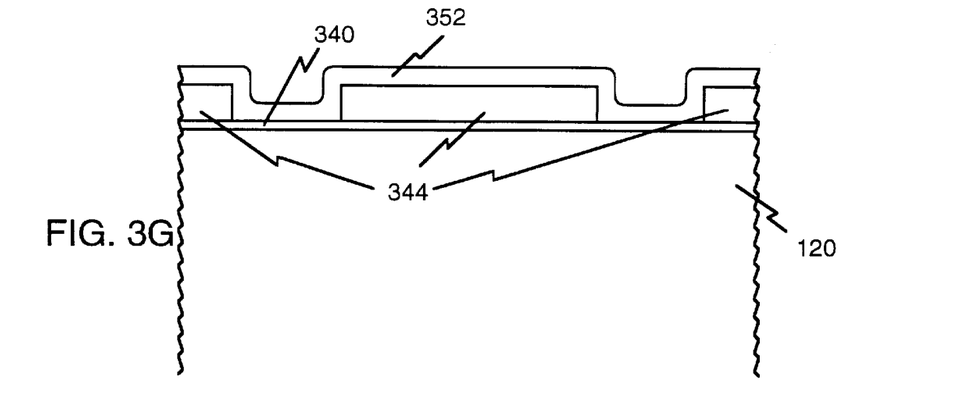
Figure 3H:
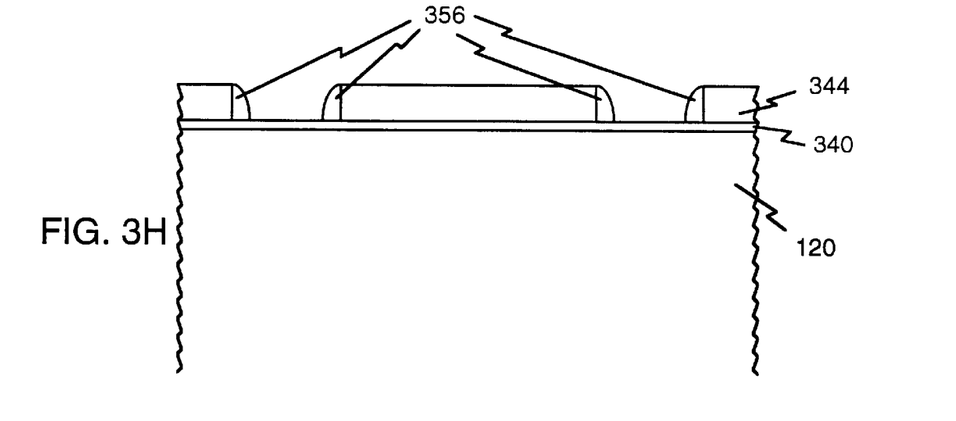
Figure 3I:
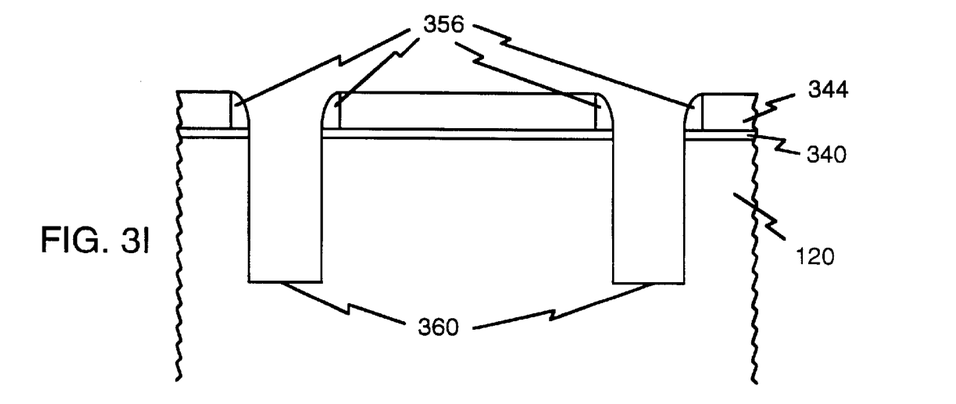

Next, a CVD oxide 352 with a thickness ranging from 100 nm to 200 nm is deposited over the entire wafer as shown in FIG. 3G. The CVD oxide 352 is then anisotropically etched to form oxide spacers 356. The regions between the oxide spacers 356 defines the regions for formation of the respective isolation trenches. As shown in FIG. 3I, a dry anisotropic silicon etch is applied to form trenches 360 of a desired depth. The etch should be selective to oxide and nitride such that they both remain relatively intact at the end of the Si trench etch.

Figure 3J:
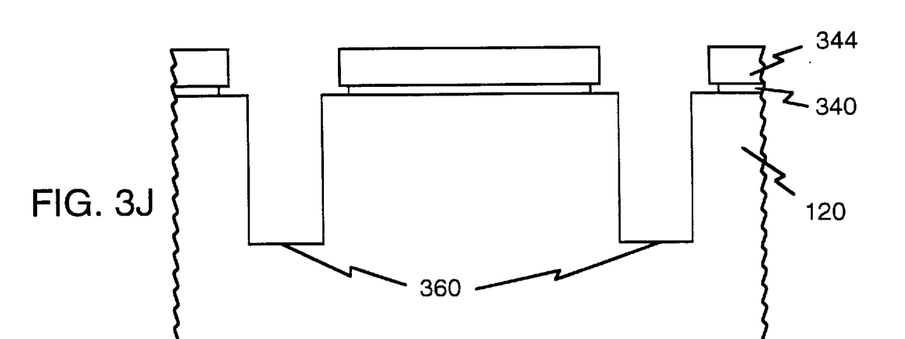
Figure 3K:
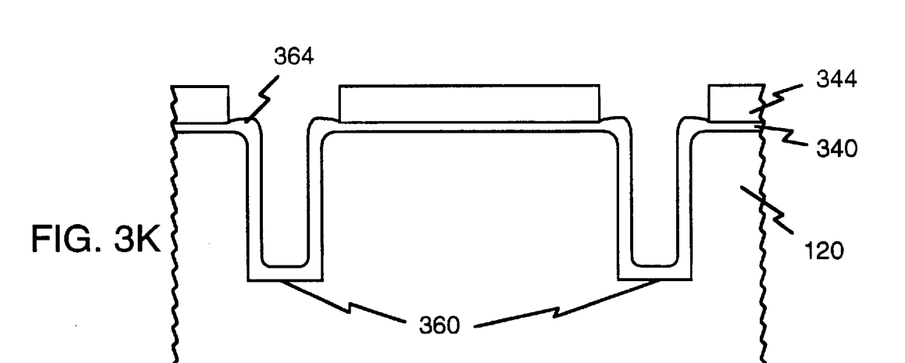

In FIG. 3J, a hydrogen fluoride (HF) dip is used to remove the oxide spacers and to under cut the pad oxide 340 under the silicon nitride 344. The oxide spacers can thus be considered disposable. Next in FIG. 3K, an oxide 364 is thermally grown on the exposed areas of the substrate 120 under high temperature conditions to round the trench corners.

By removing the oxide spacers, an offset is generated between the trench corner and an edge of the silicon nitride, under which active devices will be made. The silicon nitride substantially covers the active device area and acts as a mask during the step shown in FIG. 3K to protect the active device area from being oxidized. The high quality thermal oxides grown in the offset regions around the nitride provide excellent electrical isolation between the active device area and the field regions. Furthermore, the separation of the active devices from the trench edges reduces adverse impacts (such as parasitic leakage and poor reliability) caused by trench edges.

The trench corners become rounded because of the interaction of the substrate and the oxide under high temperatures. Growing oxide on the exposed substrate results in a consumption of the substrate. For example, at high temperatures, approximately 40% of 100 angstroms (A) of oxide growth is attributable to consumed silicon substrate.

Oxide grows at different rates. Generally speaking, with reference to FIG. 3J, oxide growth is slowest on the horizontal areas of the substrate ([100] crystal orientation), such as the bottom of the trenches 360. Oxide growth is faster on the vertical areas of the substrate ([110] orientation), such as the walls of the trenches. Oxide growth is the fastest at the corners of the trenches, where the crystal orientation is [111].

Figure 4:
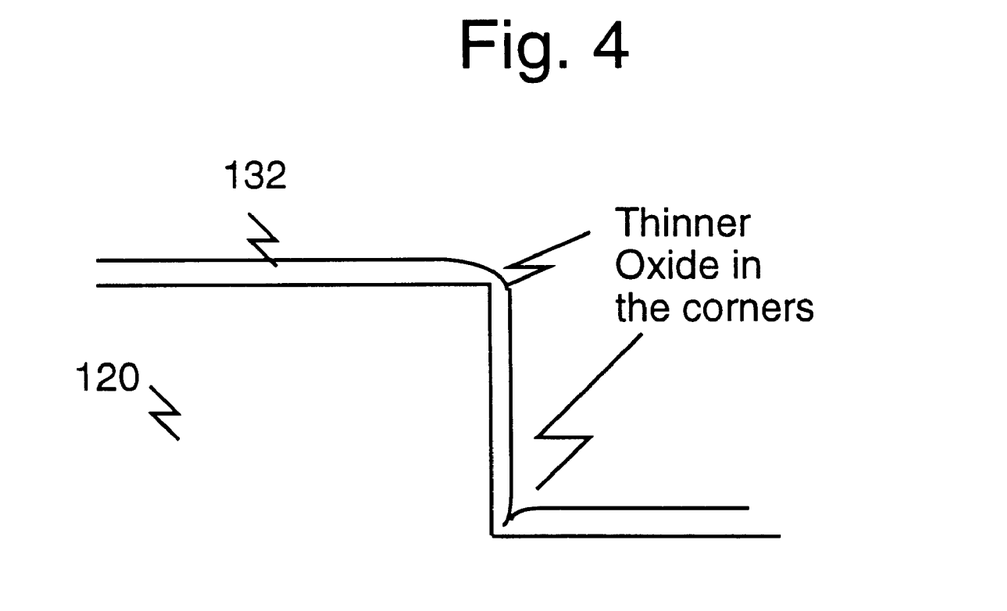
FIG. 4 shows the effect of pinched oxide at the trench corners.

However, at lower temperatures, the oxide growth is relatively slow and the oxide at the corners is too rigid to expand, and therefore the oxide becomes pinched at the corners. This effect is illustrated in FIG. 4 and results in a thinning of the oxide at the trench corners.

At high temperatures ($\geq 1000°$ C.), the oxide growth is very fast and the oxide is viscous enough to expand the growth unimpeded. The oxide therefore becomes thicker in the corners. Accordingly, more silicon is consumed in the area of the corners of the trenches than on the top surface of the substrate or the walls of the trenches. This variation in the rate of consumption results in a rounding of the corners.

While particular embodiments according to the invention have been illustrated and described above, it will be clear to one of ordinary skill in the art that the invention can take a variety of forms and embodiments within the scope of the appended claims.

What is claimed is:

1. A method of rounding and thickening the corners of isolating trenches formed in a semiconductor body with a planar surface comprising the steps of:

(1) forming a masking material on said planar surface of said semiconductor body having an oxide pad, wherein edges of said masking material are offset from said corners of the to-be-formed isolating trenches;

(2) forming spacers having exposed walls on said oxide pad on the semiconductor body in said offset adjacent said masking material;

(3) etching said isolating trenches from said semiconductor body in regions defined by the exposed walls of said spacers;

(4) removing said spacers to leave an exposed offset portions of said planar surface between edges of said masking material and corners of said isolating trenches; and (5) growing an oxide on an exposed portion of said semiconductor body under high temperature, said exposed portion comprising said isolating trenches and the offset portions of said planar surface adjacent said corners of said isolating trenches which are not covered by said masking material, whereby the grown oxide rounds the corners of said isolating trenches and thickens the corners greater than said oxide pad and extends above the oxide pad.

2. The method as recited in claim 1, wherein step 2 comprises the steps of:

(1) depositing an insulating material over said semiconductor body, wherein said insulating material covers said masking material and said planar surface in regions of said semiconductor body not covered by said masking material; and (2) etching said insulating material to form said spacers.

3. The method as recited in claim 1, wherein said masking material comprises silicon nitride.

4. The method as recited in claim 1, wherein said high temperature is in excess of 10000° C.

5. A method of rounding and thickening corners of an isolating trench formed in a semiconductor body with a planar surface comprising the steps of:

(A) growing a silicon oxide pad on said planar surface;

(B) depositing silicon nitride on said silicon oxide pad;

(C) disposing a photoresist mask with an aperture on said silicon nitride, said aperture defining a first region;

(D) etching a portion of said silicon nitride which is aligned with said aperture;

(E) depositing an insulating material over said semiconductor body, wherein said insulating material covers said silicon nitride and said first insulating material forms a channel in the first region;

(F) etching said insulating material to form a pair of spacers, said spacers defining a second region, said second region having a width less than a width of said first region;

(G) etching said silicon oxide pad and said semiconductor body after the formation of said second region defined by said spacers to form an isolating trench of the width of said second region and a predetermined depth, said isolating trench forming corners with said planar surface;

(H) removing said spacers using hydrogen fluoride dip to leave an offset between edges of said silicon nitride and corners of said isolating trench and to create an undercut in said silicon oxide pad under said silicon nitride; and (I) growing an oxide on exposed regions of said semiconductor body under high temperature, whereby said corners of said isolating trench are rounded and thicker than said oxide pad and extend above the oxide pad.

6. A method of rounding and thickening corners of an isolating trench formed in a semiconductor body with a planar surface comprising the steps of growing a thin silicon oxide pad on said planar surface;

depositing a thick insulating layer on said oxide pad, said thick insulating layer having an etch selectivity different from the oxide pad;

forming a mask pattern with an aperture on said insulating layer, said aperture defining a first region;

etching a portion of said insulating layer aligned with the aperture by using an etchant having a greater selectivity for the insulating layer than the oxide pad so as to remove the insulating layer in the first region but not the oxide pad;

depositing a conformal insulating material over said insulating layer and in said first region, wherein said conformal material forms a layer on the walls of insulating layer in the first region and on the oxide pad on the bottom of the first region;

etching said conformal material with an anisotropic etchant selective for said conformal material to remove the conformal material on the surface of the insulating layer and on the oxide pad but not on said walls of insulating layer in the first region to form spacers in the first region defining a second region, said second region having a width less than a width of said first region;

etching said oxide pad and said semiconductor body in said second region with anisotropic etchants selective thereto to form an isolating trench of the width of said second region, said isolating trench forming corners with said planar surface;

removing the spacers from said first region to leave exposed offset portions of said planar surface between edges of said masking material and corners of said isolating trench: and growing an oxide on exposed areas of said semiconductor body, whereby said corners of said isolating trench are rounded and thicker than the thin oxide pad and extend above the oxide pad.

7. The method of claim 6 wherein said spacers are removed using an etchant having an etch selectivity for both the conformal material and the oxide pad, whereby the oxide pad is partially removed under the insulating layer at the edges defining said first region.

8. The method of claim 7 wherein said etchant is isotropic.

* * * * *